(12) United States Patent
Arvin et al.

(10) Patent No.: US 9,728,440 B2
(45) Date of Patent: Aug. 8, 2017

(54) NON-TRANSPARENT MICROELECTRONIC GRADE GLASS AS A SUBSTRATE, TEMPORARY CARRIER OR WAFER

(71) Applicant: International Business Machines Corporation, Armonk, NY (US)

(72) Inventors: Charles L. Arvin, Savannah, GA (US); Harry D. Cox, Rifton, NY (US); Brian M. Erwin, Lagrangeville, NY (US); Jorge A. Lubguban, Ridgefield, CT (US); Eric D. Perfecto, Poughkeepsie, NY (US); Jennifer D. Schuler, Poughquag, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 175 days.

(21) Appl. No.: 14/525,267

(22) Filed: Oct. 28, 2014

(65) Prior Publication Data
US 2016/0118287 A1  Apr. 28, 2016

(51) Int. Cl.
| | | |
|---|---|---|
| *B32B 41/00* | (2006.01) | |
| *H01L 21/683* | (2006.01) | |
| *B32B 9/04* | (2006.01) | |
| *B32B 17/06* | (2006.01) | |
| *B32B 7/12* | (2006.01) | |
| *B32B 7/06* | (2006.01) | |
| *H01L 21/66* | (2006.01) | |

(52) U.S. Cl.
CPC ........... *H01L 21/6835* (2013.01); *B32B 7/06* (2013.01); *B32B 7/12* (2013.01); *B32B 9/04* (2013.01); *B32B 17/06* (2013.01); *B32B 2457/14* (2013.01); *H01L 22/12* (2013.01); *H01L 2221/6834* (2013.01); *H01L 2221/68318* (2013.01); *H01L 2221/68327* (2013.01); *H01L 2221/68381* (2013.01)

(58) Field of Classification Search
CPC ... H01L 21/6835; H01L 22/12; H01L 21/302; H01L 2221/68327; H01L 2221/6834; H01L 2221/68318; H01L 2221/68381; B32B 17/06; B32B 9/04; B32B 7/12; B32B 2457/14
USPC .............................. 156/60, 64, 350, 378, 379
See application file for complete search history.

(56) References Cited

U.S. PATENT DOCUMENTS

| | | |
|---|---|---|
| 8,778,738 B1 | 7/2014 | Lin et al. |
| 2004/0188804 A1* | 9/2004 | Nakayama ............ H01L 23/544 257/620 |
| 2014/0034374 A1 | 2/2014 | Cornejo et al. |
| 2014/0073087 A1 | 3/2014 | Huang et al. |
| 2014/0145328 A1 | 5/2014 | Tummala et al. |
| 2014/0183758 A1 | 7/2014 | Nakamura et al. |

FOREIGN PATENT DOCUMENTS

| | | |
|---|---|---|
| WO | 0250913 A2 | 6/2002 |
| WO | 2013153923 A1 | 10/2013 |

* cited by examiner

*Primary Examiner* — Michael N Orlando
*Assistant Examiner* — Joshel Rivera
(74) *Attorney, Agent, or Firm* — Anthony Canale; Andrew M. Calderon; Roberts Mlotkowski Safran Cole & Calderon, P.C.

(57) ABSTRACT

A method for processing a semiconductor wafer where an opaque layer is located on a surface of a handling wafer is used so the surface of the handling wafer may be detected through optical sensors. The opaque layer may be modified, or oriented, to allow light to pass through unobstructed.

9 Claims, 6 Drawing Sheets

NON-TRANSPARENT MICROELECTRONIC GRADE GLASS AS A SUBSTRATE, TEMPORARY CARRIER OR WAFER

BACKGROUND

The present invention relates to wafer handling, inspection, debonding and, more specifically, to advanced methods for wafer handling and inspection.

Three-dimensional (3D) chip technologies include 3D integrated circuits (IC) and 3D packaging. 3D chip technologies are gaining widespread importance as they allow for greater integration of more complex circuitry with shorter circuit paths allowing for faster performance and reduced energy consumption. In 3D ICs, multiple thin silicon wafer layers are stacked and interconnected vertically to create a single integrated circuit of the entire stack. In 3D packaging, multiple discrete ICs are stacked, interconnected, and packaged together.

Modern techniques for 3D chip technologies, including both 3D ICs and 3D packaging, may utilize through-silicon vias (TSV). A TSV is a vertical interconnect access (VIA) in which a connection passes entirely through a silicon wafer or die. By using TSVs, 3D ICs and 3D packaged ICs may be more tightly integrated as edge wiring and interposer layers are not required.

Temporary wafer bonding/debonding is an important technology for implementing TSVs and 3D silicon structures in general. Bonding is the act of attaching a silicon device wafer, which is to become a layer in a 3D stack, to a substrate or handling wafer so that it can be processed, for example, with wiring, pads, and joining metallurgy, while allowing the wafer to be thinned, for example, to expose the TSV metal of blind vias etched from the top surface.

Debonding is the act of removing the processed silicon device wafer from the substrate or handling wafer so that the processed silicon device wafer may be added to a 3D stack.

BRIEF SUMMARY

An embodiment of the invention may include a method for processing a semiconductor wafer by bonding the semiconductor wafer to a handling wafer using an adhesive and release layer. The handling wafer may have an opaque layer covering an entire exterior surface of a transparent wafer. The method may include processing the semiconductor wafer while it is bonded to the transparent wafer. The method may include ablating the adhesive and release layer through the transparent wafer and removing the semiconductor wafer from the handling wafer.

Another embodiment of the invention may include a method for processing a semiconductor wafer by bonding the semiconductor wafer to a handling wafer using an adhesive and release layer. The handling wafer may have an opaque layer covering a portion of a surface of a transparent wafer. The method may include processing the semiconductor wafer while it is bonded to the transparent wafer. The method may include ablating the adhesive and release layer through the transparent wafer and removing the semiconductor wafer from the handling wafer.

Another embodiment of the invention may include a semiconductor structure with a support wafer. The support wafer may contain a transparent wafer and an opaque surface on at least a portion of a surface of the transparent wafer. A semiconductor wafer may be bonded to the support wafer.

BRIEF DESCRIPTION OF THE SEVERAL DRAWINGS

Figure 1A:
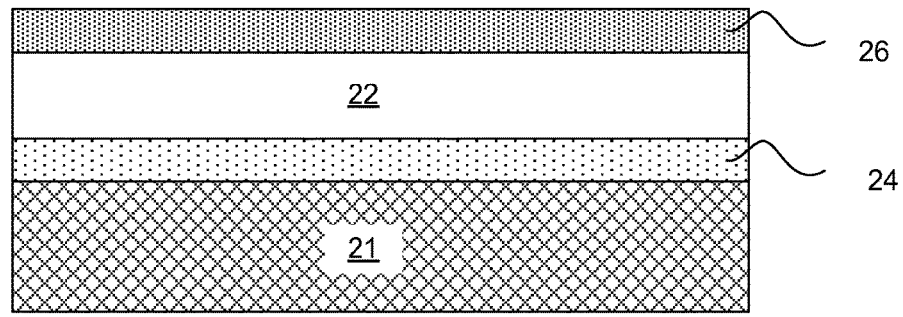
FIG. 1a illustrates a process flow, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention entails bonding of a temporary handling wafer to a semiconductor device wafer to aid in manufacturing and testing. The handling wafer may be used to provide structural support during processing of the semiconductor wafer devices, and the use of a transparent handling wafer may allow for more accurate measurement and testing of the structures and materials on the semiconductor wafer device, as well as allowing the use of laser ablation to separate the handling wafer from the semiconductor device wafer. However, the machinery and robotics used in semiconductor device manufacture often uses optical sensors to detect the position of the semiconductor wafer, and transparent wafers may cause issues for such technology. Further, while techniques exist that allow for marking the surface of a handling wafer, often the removal of such markings requires the use of harsh chemicals (e.g. caustic solutions or aggressive solvents), which may have detrimental impacts on the structures on the semiconductor wafer. Thus, it may be beneficial to develop a method and/or structure that would allow light to pass through to the semiconductor device wafer when observation or release is desired, yet maintain a surface capable of optical detection when the semiconductor device wafer needs to be handled by processing machinery or robotics. In other embodiments, the opaque layer may only be placed on portions of the surface of the handling wafer, so that the opaque layer may aid in optical detection, but not cover so much of the surface as to obscure light from passing to the underlying structures.

Referring to FIG. 1a, a handling wafer 22 may be bonded to a device wafer 21. The device wafer 21 may be a silicon wafer that is to be processed, for example, to be added to a 3D stack such as a layer in a 3D IC or an IC to be included in a 3D package. The device wafer 21 may be processed prior to bonding. However, prior to bonding the device wafer 21 may be a full-thickness wafer. The device wafer 21 may be bonded to the handling wafer 22 to provide structural support during subsequent processing which may include a thinning of the device wafer 21. The device wafer 21 need not comprise silicon and may instead comprise an alternative semiconductor material. The device wafer 21 may originate as a full-thickness wafer and may subsequently be thinned down to a size of between approximately 200 um and 20 um.

Figure 3A:
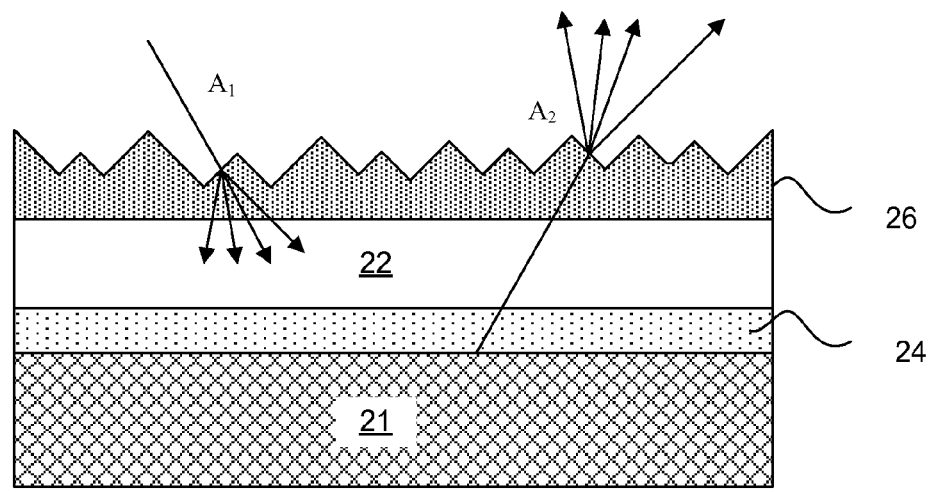
FIG. 3a is a cross-sectional view of light scattering due to an opaque surface of a handling wafer, according to an example embodiment.

The handling wafer 22 may be a transparent substrate and may comprise, for example, Borofloat glass. The handling wafer 22 may be sufficiently thick to provide structural integrity to the device wafer 21 bonded thereto. For example, the handling wafer 22 may be approximately 650 µm thick. In an exemplary embodiment, the handling wafer 22 may have an opaque layer 26 located on the outer surface. The opaque layer 26 on the outer portion of the handling wafer 22 may allow optical detection by wafer handling machinery. The opaque layer 26 may be a portion of the handling wafer 22 modified to the path of light, or may be a layer applied to the surface of the handling wafer 22. In the embodiment illustrated in FIG. 1a, the opaque layer 26 may cover the entire surface of the handling wafer 22. In an example embodiment, the opaque layer may be formed prior to adhering the handling wafer 22 to the device wafer 21 by frosting a portion of a transparent handling wafer. Frosting may be performed through chemical or mechanical means, and in general increases the roughness on the surfaces of the handling wafer 22. By increasing the roughness of the surface of the handling wafer 22, light may be obscured as it passes through, which an example is illustrated in FIG. 3a and further described below, which may allow for detection by optical sensors. In exemplary embodiments, the opaque layer is located on the surface of the handling wafer 21 exposed to the environment so that it may be modified to change the opacity of light passing through that layer. While the above embodiment of an opaque layer 26 is on a transparent handling wafer, one will appreciate that other transparent substrates, such as transparent interposers (e.g. glass interposers) or transparent boards (e.g. glass boards) also would benefit from the described opaque layer 26.

An adhesive and release layer 24 may be provided between the device wafer 21 and the handling wafer 22. The adhesive and release layer 24 may include a single layer, or may be made up of multiple layers, where each of the layers may contain one or more materials. The adhesive and release layer 24 may adjoin the handling wafer 22 to the device wafer 21 for processing, but be capable of releasing the handling wafer 22 from the device wafer 21 during laser ablation. The adhesive and release layer 24 may be transparent, or sufficiently transparent, to wavelengths of light that would allow for examination of the underlying device wafer 21. According to one exemplary embodiment of the present invention, the adhesive and release layer 24 is deposited directly upon the handling wafer 22. The adhesive and release layer 24 may comprise a material that is highly specialized to absorb strongly near the UV wavelength of laser light used during laser ablation. As exemplary embodiments of the present invention may employ a UV laser, for example, at or near the wavelength 355 nm, the adhesive and release layer 24 may comprise a material highly absorbent of UV light, and in particular, light having a 355 nm wavelength.

The adhesive and release layer 24 may comprise a material that can be laser ablated at the UV wavelength of choice. The adhesive and release layer 24 may be generated, for example, by spin coating or spraying the material for the adhesive and release layer 24 material, for example, onto the handling wafer 22, and then curing the material using heat (e.g. 350° C.) and/or UV light. Curing the material for the adhesive and release layer 24 may either be performed prior to bonding of the handling wafer 22 to the device wafer 21 or at the same time.

In embodiments where multiple layers are used to create the adhesive and release layer 24, an adhesive layer may be applied to either the device wafer 21 or to a release layer previously applied to the handling wafer 22. The adhesive layer may comprise a distinct material from that which is used as the release layer, and in particular, the adhesive layer may be an adhesive that does not strongly absorb the light of the wavelength that is used to ablate the release layer. The adhesive and release layer may be created, for example, by applying the adhesive material to the device wafer 21. The adhesive and release layer 24 may be cured using heat (e.g. 220° C.).

Figure 2A:
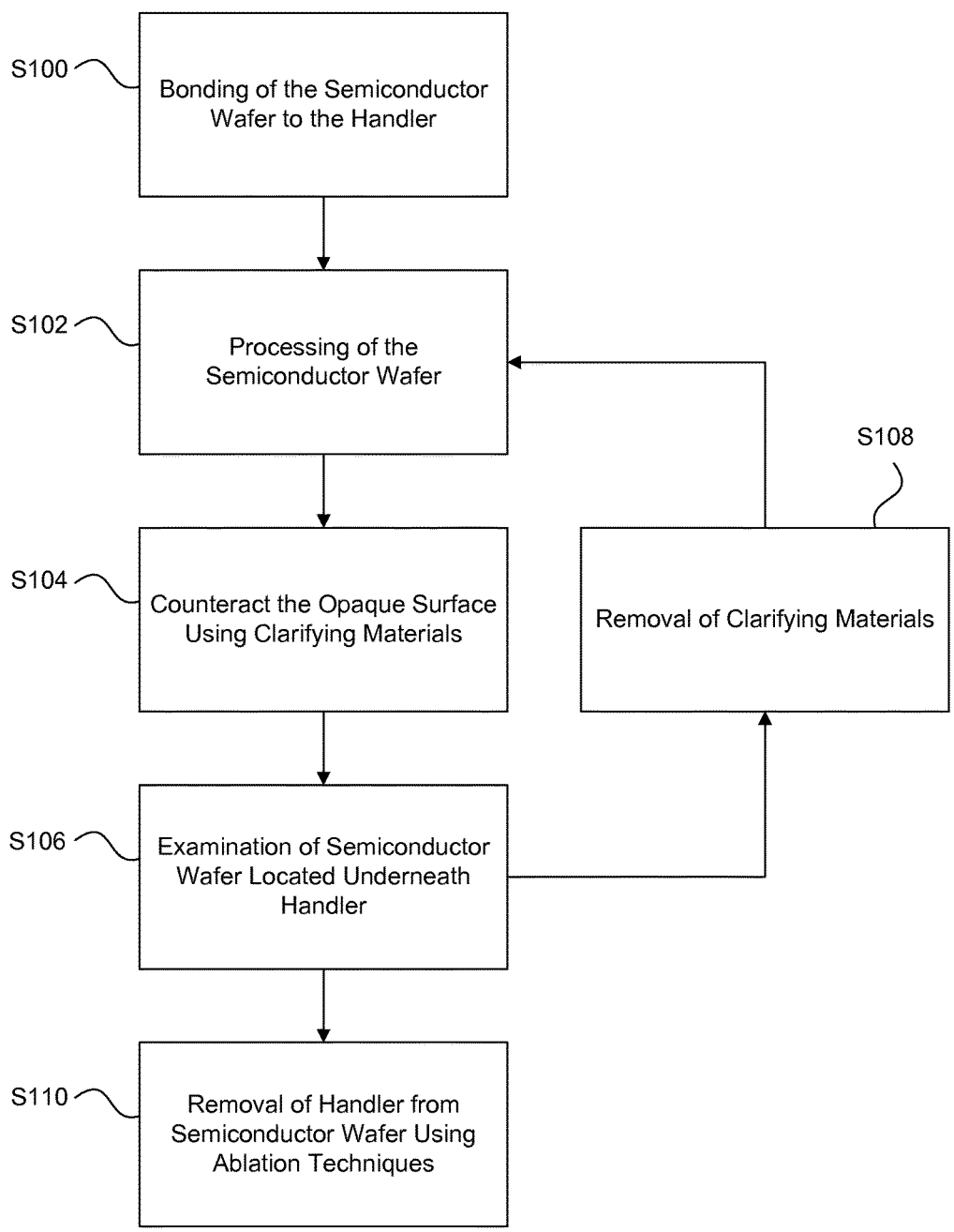
FIG. 2a is a cross-sectional view of a device wafer attached to a handling wafer, according to an example embodiment.

Referring now to FIG. 2a, an example process flow is described where a handling wafer having an opaque layer on the outer surface may be joined to a device wafer, and then the device wafer undergoes typical semiconductor processing. Following, or during, a processing step, a material pay be deposited on the opaque layer which may allow for light to pass through the handling wafer without being obscured by the opaque layer. This material may be removed to allow for further processing to occur, or may be maintained on the surface of the handling wafer to enable laser ablation during removal of the handling wafer from the semiconductor wafer.

Referring to step S100 in FIG. 2a, the structure of FIG. 1a may be created by joining the device wafer 21 to the handling wafer 22, using an adhesive and release layer 24.

Referring to step S102 in FIG. 2a, processing of the device wafer 21 may occur. Processing may include typical semiconductor process steps such as patterning, etching, thinning, etc. until the device wafer has achieved its desired state. For example, for 3-D chip manufacture the device wafer 21 may be thinned to allow for proper through-silicon via formation during subsequent processing.

Referring to step S104 in FIG. 2a, a clarifying material may be applied to the top of the opaque layer 26. Application of the clarifying material may allow light to pass through the handling wafer 22 without substantial scattering of the light, and thus will reduce or eliminate the amount of processing necessary to observe phenomenon occurring below the glass. Additionally, it may allow for laser ablation of the adhesion and release layer 24 following the processing of the device wafer 21. In determining the type of clarifying material, the surface roughness of the opaque layer 26, as well as the desired resolution for the underlying structures, may play a role in determining how similar the refractive index of the clarifying material needs to be to the opaque layer 26. In exemplary embodiments, the clarifying material may be any liquid, solid, solution or combination of thereof that has substantially the same refractive index as the opaque layer 26 such as, for example, such as a refractive index within about 0.5, more preferably within about 0.3 and even more preferably within about 0.1.

Figure 3B:
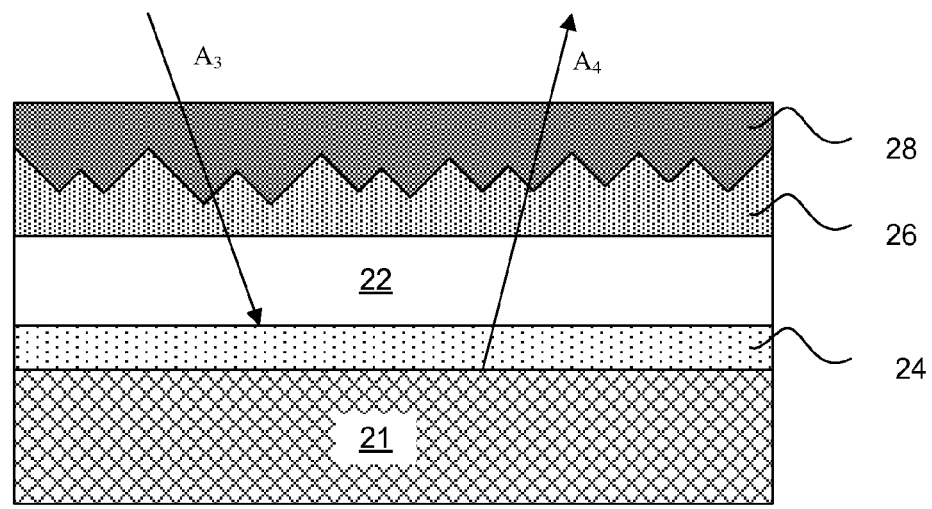
FIG. 3b is a cross-sectional view of the reduction of light scattering due to a clarifying layer above an opaque surface of a handling wafer, according to an example embodiment.

FIG. 3a is an example illustration of a handling wafer 22 bonded to a device wafer 21 by an adhesive and release layer 24, where an opaque layer 26 on the surface of the handling wafer 22 is frosted glass. Arrows $A_1$ and $A_2$ show illustrative examples of how light scatters when traveling to and from the handling wafer, respectively. The light scatters as it crosses through the rough air/glass interface of the frosted glass. In such embodiments, this interface may obscure any visual images located below the surface, as well as any light passing towards the device wafer 21. Due to this scattering, observing or processing images of the underlying structures is computationally intensive. By applying a clarifying layer 28 with a similar refractive index as the opaque layer 26, scattering of the light passing through the interface may be reduced, as illustrated by arrows $A_3$ and $A_4$ in FIG. 3b. This occurs because when light enters the substantially flat surface of the clarifying layer 28, and passes into the opaque layer 26, the similarities of the refractive indexes between the two materials reduces the angle of refraction, and thus decreases the scattering of light because the rough surface of the opaque layer is effectively turned into the flatter surface of the clarifying layer 28.

Referring to step S106 in FIG. 2a, optical inspection may be performed on the device wafer 21 at any stage during the processing of the device wafer 21 and/or after all processing has been completed. According to some embodiments of the present invention, optical inspection may be performed after one or more critical processing steps that are likely to create defects. In the event that optical inspection results in a determination that a defect is present in the device wafer 21, the device wafer 21 may be rejected on the spot and subsequent processing may be canceled. In other embodiments, optical inspection may include tracking of underfill flow characteristics to analyze process parameters. Because the device wafer 21 may be optically inspected through the handling wafer 22 and the adhesion and release layer 24, removal of the device wafer 21 from the handling wafer 22 is not required to perform testing and accordingly, defects may be detected at an earlier stage in processing than would otherwise be possible. Additionally, waiting until the entire 3D stack has been assembled before performing testing may result in the rejection of the entire 3D stack thereby substantially reducing yield and adding substantially to the cost of manufacture. Moreover, seeing the bonded interface through the glass may be useful in that it may be verified that processing has not generated small voids in the bonding adhesive itself, which can lead to yield loss during thinning and vacuum processing. Because defects such as these may be known to exist at early stages of processing, subsequent processing steps performed on the wafer defective may be avoided.

Referring to step S108 in FIG. 2a, if additional processing is necessary, the filling material may be removed from above the surface of handling wafer. Removal of the filling material may be performed by any means that removes the substance from the surface of the handling wafer, such as evaporation for liquids, or sucking the material off of the surface.

Figure 5A:
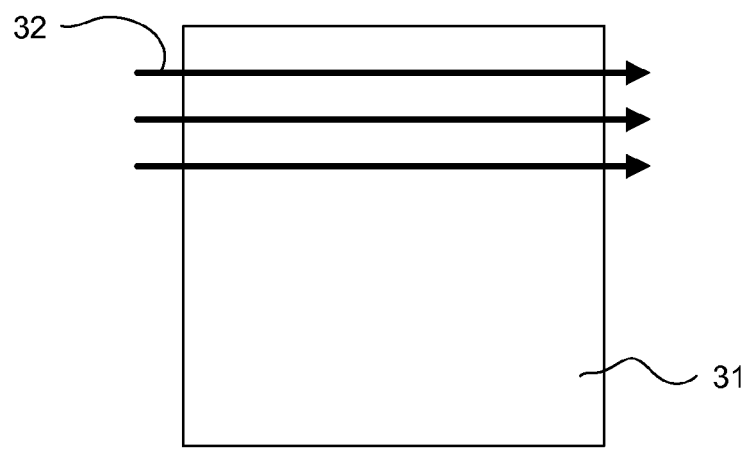
FIG. 5a is a schematic illustration of the pattern of laser ablation, according to an example embodiment.
Figure 5B:
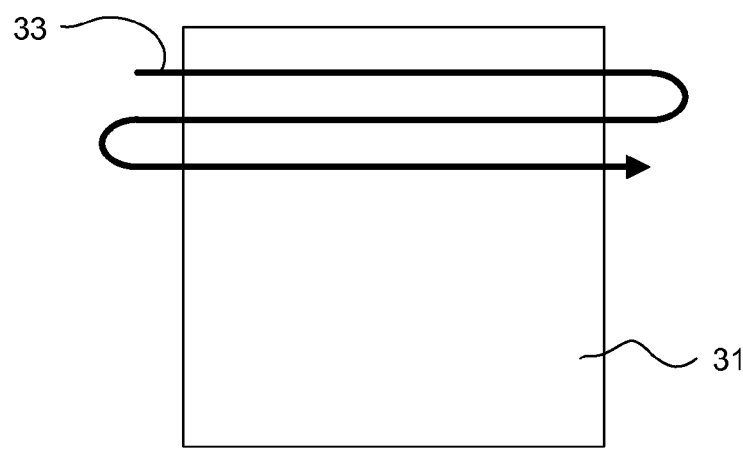
FIG. 5b is a schematic illustration of the pattern of laser ablation, according to an example embodiment.

Referring to step S110 in FIG. 2a, when the processing, testing and repair is complete, and it is time to debond the device wafer 21 from the handling wafer 22, a laser may be used to irradiate the adhesive and release layer 24. The adhesive and release layer 24 may be irradiated though the handling wafer 22, the clarifying layer 28 (FIG. 3b) and the opaque layer, which may all be transparent, at least to the wavelength of the laser used. The laser may produce a spot beam that is scanned across the surface of the handling wafer 22, for example, in a raster pattern, or the laser may produce a fan beam that is swept once or multiple times across the handling wafer 22. Directing of the light radiated from the laser may be handled by the use of a scanner and lens, which may be, for example, an F-Theta scan lens having an 810 mm fl. FIGS. 5a and 5b are a schematic diagram illustrating pattern of applying the laser light to a top surface 31 of the handling wafer 22 in accordance with exemplary embodiments of the present invention. As seen in FIG. 5a, the laser light may be directed across the top surface 31 of the handling wafer 22 as a spot beam drawn to lines 32 which move along an x-axis direction of the top surface 31 of the handling wafer 22 with each successive line 32 being drawn lower in the y-axis direction. Alternatively, as seen in FIG. 5b, the laser light may be directed in a serpentine pattern 33.

As the UV wavelength of the laser used may contain relatively high energy, the light may efficiently ablate the adhesive and release layer 24. Once ablated, the device wafer 21 may be freely removed from the handling wafer 22. Thereafter, if necessary, a solvent or cleaning chemical may be used to remove any remaining elements of the adhesive and release layer 24 and/or adhesive and release layer 24 that may remain on the device wafer 21. The debonded and cleaned device wafer 21 may then be further processed, diced and applied to a 3D stack and/or joined to a package or another 3D element.

In additional embodiments, the handling wafer 22 may be left adhered to the device wafer 21, in order to act as a transparent interposer or a transparent board during subsequent semiconductor manufacture. In such embodiments, the adhesive and release layer 24 may be selected without regard to the need to release the handling wafer 22 from the device wafer 21.

Figure 2B:
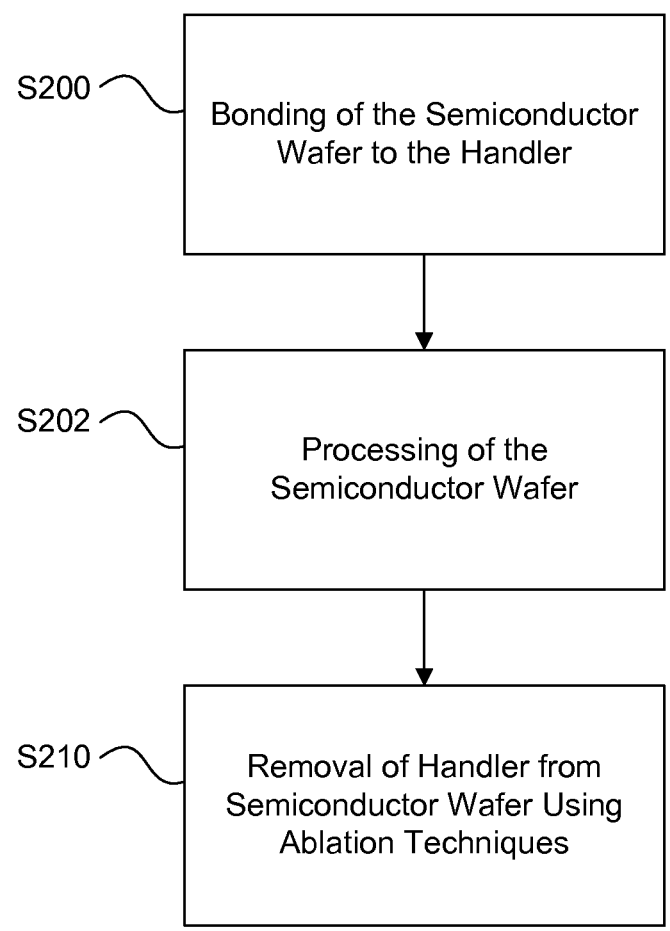
FIG. 2b is a cross-sectional view of a device wafer attached to a handling wafer, according to an example embodiment.

Referring now to the process flow illustrated in FIG. 2b, a handling wafer having an opaque layer on the outer surface may be joined to a device wafer, and then the device wafer undergoes typical semiconductor processing. Following processing of the semiconductor wafer, laser ablation techniques tuned for use with the opaque layer may be used to remove the handling wafer from the semiconductor wafer.

Referring to step S200 in FIG. 2b, a handling wafer 22 may be bonded to a device wafer 21, as illustrated in FIG. 1a, and described above.

Referring to step S202 in FIG. 2b, processing of the device wafer 21 may occur. Processing may include such process steps as patterning, etching, thinning, etc. until the device wafer has achieved its desired state.

Referring to step S210 in FIG. 2b, when the processing, testing and repair is complete, and it is time to debond the device wafer 21 from the handling wafer 22, a laser may be used to irradiate the adhesive and release layer 24. The adhesive and release layer 24 may be irradiated though the opaque layer 26 and the handling wafer 22. The laser may produce a spot beam that is scanned across the surface of the handling wafer 22, for example, in a raster pattern, or the laser may produce a fan beam that is swept once or multiple times across the handling wafer 22. Directing of the light radiated from the laser may be handled by the use of a scanner and lens, which may be, for example, an F-Theta scan lens having an 810 mm fl. FIGS. 5a and 5b is a schematic diagram illustrating pattern of applying the laser light to a top surface 31 of the handling wafer 22 in accordance with exemplary embodiments of the present invention. As seen in FIG. 5a, the laser light may be directed across the top surface 31 of the handling wafer 22 as a spot beam drawn to lines 32 which move along an x-axis direction of the top surface 31 of the handling wafer 22 with each successive line 32 being drawn lower in the y-axis direction. Alternatively, as seen in FIG. 5b, the laser light may be directed in a serpentine pattern 33.

As the UV wavelength of the laser used may contain relatively high energy, the light may efficiently ablate the adhesive and release layer 24. To counteract the light obscuring properties of the opaque layer, the fluence of the laser may be increased in order to increase the intensity of the laser light that reaches the adhesion and release layer 24 during laser ablation. For example, the intensity of the laser transmitted may be 50% more than would be necessary for the adhesion and release layer 24 to soften or degrade. Once ablated, the device wafer 21 may be freely removed from the handling wafer 22. Thereafter, if necessary, a solvent or cleaning chemical may be used to remove any remaining elements of the adhesive and release layer 24 and/or adhesive and release layer 24 that may remain on the device wafer 21. The debonded and cleaned device wafer 21 may then be further processed, diced and applied to a 3D stack and/or joined to a package or another 3D element.

In additional embodiments, the handling wafer 22 may be left adhered to the device wafer 21, in order to act as a transparent interposer or a transparent board during subsequent semiconductor manufacture. In such embodiments, the adhesive and release layer 24 may be selected without regard to the need to release the handling wafer 22 from the device wafer 21.

Figure 1B:
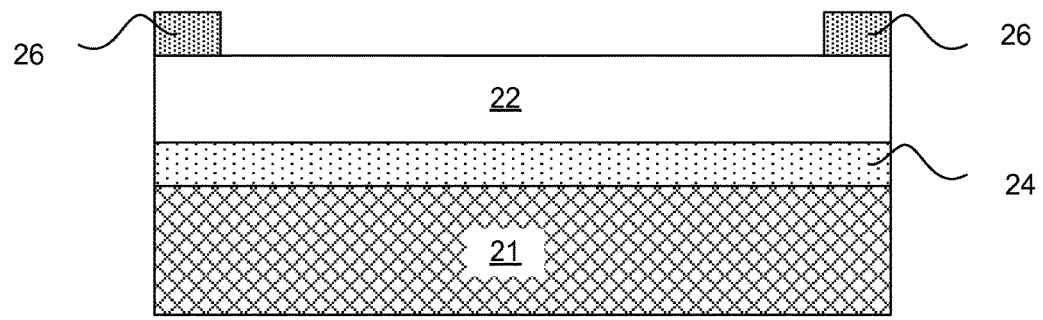
FIG. 1b illustrates a process flow, according to an example embodiment.
Figure 1C:
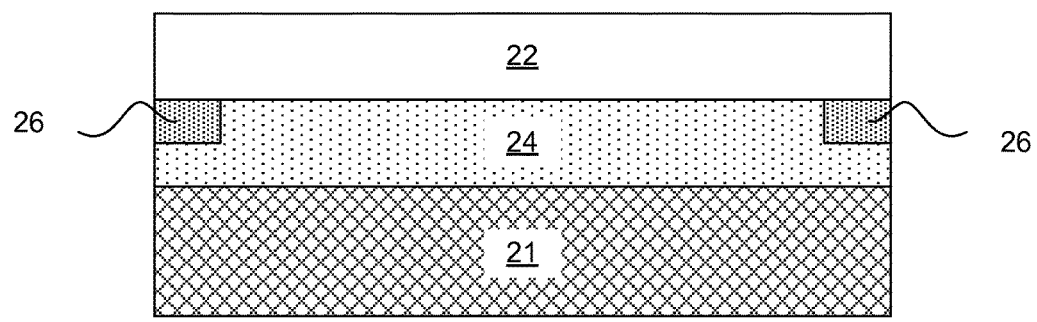
FIG. 1c illustrates a process flow, according to an example embodiment.

FIGS. 1b and 1c illustrate the semiconductor structure following the bonding of the handling wafer 22 to the device wafer 21. The device wafer 21 may be a silicon wafer that is to be processed, for example, to be added to a 3D stack such as a layer in a 3D IC or an IC to be included in a 3D package. The device wafer 21 may be processed prior to bonding, however, prior to bonding the device wafer 21 may be a full-thickness wafer. The device wafer 21 may be bonded to the handling wafer 22 to provide structural support during subsequent processing which may include a thinning of the device wafer 21. The device wafer need not comprise silicon and may instead comprise an alternative semiconductor material. The device wafer 21 may originate as a full-thickness wafer and may subsequently be thinned down to a size of between approximately 200 um and 20 um.

Figure 4:
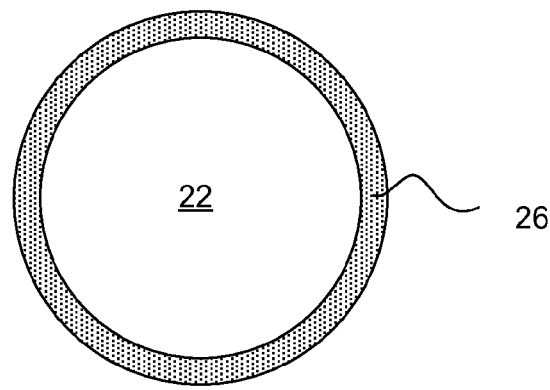
FIG. 4 is a top view of a handling wafer partially covered by an opaque layer, according to an example embodiment.

The handling wafer 22 may be a transparent substrate and may comprise, for example, Borofloat glass. The handling wafer 22 may be sufficiently thick to provide structural integrity to the device wafer 21 bonded thereto. For example, the handling wafer 22 may be approximately 650 μm thick. In an exemplary embodiment, an opaque layer may cover portion of the handling wafer. In some embodiments, the opaque layer may be located on the outer edge of the wafer, as illustrated in FIG. 4. In an example embodiment, the opaque layer may be 2 mm wide in order for proper detection, and removal, however other widths are specifically contemplated depending on the materials and machinery used, but are preferably less than 5 mm. In some embodiments, the opaque layer 26 may be placed on other various parts of the wafer, and in any number of shapes. The opaque layer 26 may be located on either side of the handling wafer 22, either between the handling wafer 22 and the device wafer 21 (FIG. 1c), or on the portion of the handling wafer exposed to the environment (FIG. 1b). The opaque layer may be a layer deposited on the handling wafer, as illustrated in FIG. 1b and FIG. 1c, or may be embedded in the handling wafer (not shown).

The opaque layer 26 may be created through any number of ways to increase the opacity of an object such as, for example, scratching the surface of the handling wafer 22 or applying a material on the surface of the handling wafer. In some embodiments, a thin metal, metal oxide, and/or metal nitride layer (or layers) may be applied to the surface of the handling wafer 22. In such embodiments, a metal such as, for example, tantalum or tantalum nitride, may be applied using a sputtering technique and a shield. The shield may cover portions of the handling wafer, while leaving other portions exposed, to create a desired pattern on the handling wafer. In such techniques, the surface of the metal may be converted to a metal nitride to reduce the occurrence of adverse interactions with the process machinery. While the above embodiment of an opaque layer 26 is on a transparent handling wafer, one will appreciate that other transparent substrates, such as transparent interposers (e.g. glass interposers) or transparent boards (e.g. glass boards) also would benefit from the described opaque layer 26.

An adhesive and release layer 24 may be provided between the device wafer 21 and the handling wafer 22. The adhesive and release layer 24 may include a single layer, or may be made up of multiple layers, where each of the layers may contain one or more materials. The adhesive and release layer 24 may adjoin the handling wafer 22 to the device wafer 21 for processing, but be capable of releasing the handling wafer 22 from the device wafer 21 using laser ablation. The adhesive and release layer 24 may be transparent, or sufficiently transparent, to wavelengths of light that would allow for examination of the underlying device wafer 21. According to one exemplary embodiment of the present invention, the adhesive and release layer 24 is deposited directly upon the handling wafer 22. The adhesive and release layer 24 may comprise a material that is highly specialized to absorb strongly near the UV wavelength of laser light used during laser ablation. As exemplary embodiments of the present invention may employ a UV laser, for example, at or near the wavelength 355 nm, the adhesive and release layer 24 may comprise a material highly absorbent of UV light, and in particular, light having a 355 nm wavelength.

The adhesive and release layer 24 may comprise a material that can be laser ablated at the UV wavelength of choice. The adhesive and release layer 24 may be generated, for example, by spin coating or spraying the material for the adhesive and release layer 24 material, for example, onto the handling wafer 22, and then curing the material using heat (e.g. 350° C.) and/or UV light. Curing the material for the adhesive and release layer 24 may either be performed prior to bonding of the handling wafer 22 to the device wafer 21 or at the same time.

In embodiments where multiple layers are used to create the adhesive and release layer 24, an adhesive layer may be applied to either the device wafer 21 or to a release layer previously applied to the handling wafer 22. The adhesive layer may comprise a distinct material from that which is used as the release layer, and in particular, the adhesive layer may be an adhesive that does not strongly absorb the light of the wavelength that is used to ablate the release layer. The adhesive and release layer may be created, for example, by applying the adhesive material to the device wafer 21. The adhesive and release layer 24 may be cured using heat (e.g. 220° C.).

Figure 2C:
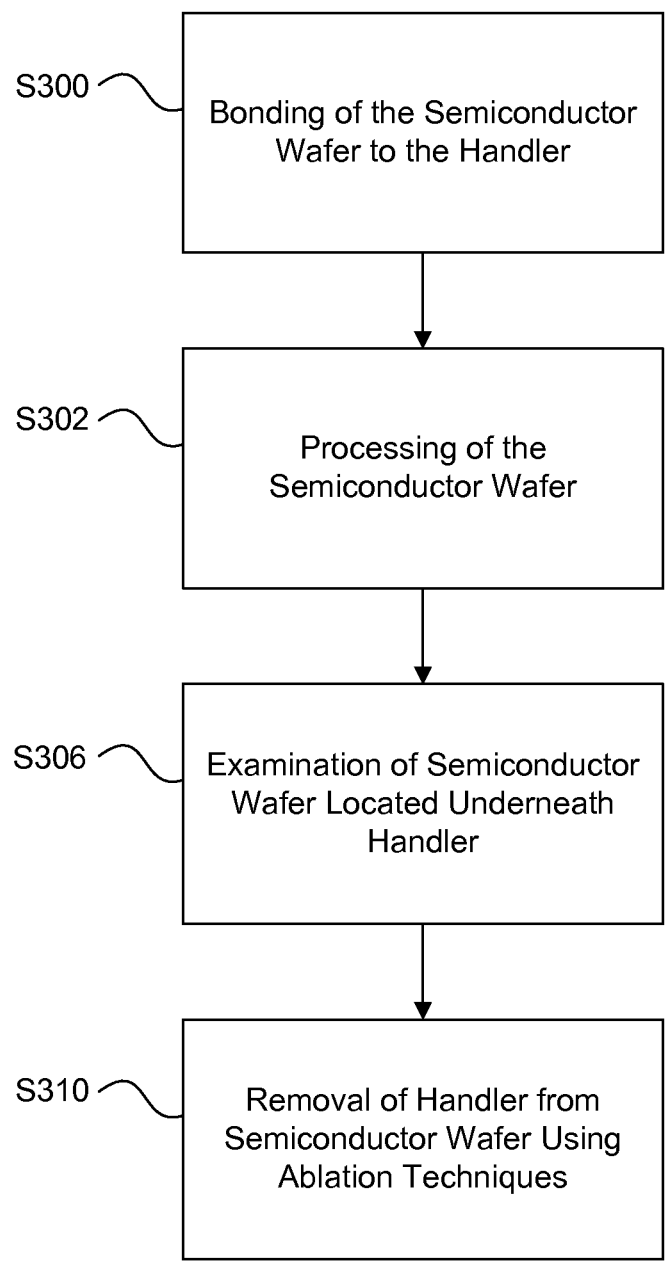
FIG. 2c is a cross-sectional view of a device wafer attached to a handling wafer, according to an example embodiment.

FIG. 2c describes a process flow of attaching a handling wafer 22 to a device wafer 21, where an opaque layer 26 only covers a desired portion of the handling wafer 22, and then performing typical semiconductor processing. Examination and ablation may then be performed without any intermediary steps, as only select portions of the handling wafer 22 are opaque. In some embodiments, the opaque layer 26 may only be located on the outer edge of the handling wafer 22 (FIG. 4), however other locations and geometries may be used, based on the equipment selected and the characteristics of the device wafer 21.

Referring to step S302 in FIG. 2c, processing of the device wafer 21 may occur. Processing may include such process steps as patterning, etching, thinning, etc. until the device wafer has achieved its desired state.

Referring to step S306 in FIG. 2c, optical inspection may be performed after all processing has been completed and/or at any stage during the processing of the wafer. According to some exemplary embodiments of the present invention, optical inspection may be performed after one or more critical processing steps that are likely to create defects. In the event that optical inspection results in a determination that a defect is present in the device wafer, the device wafer may be rejected on the spot and subsequent processing may be canceled. Because the device wafer may be optically inspected through the handling wafer 22, removal of the device wafer 21 from the handling wafer 22 is not required to perform testing and accordingly, defects may be detected at an earlier stage in processing than would otherwise be possible. Additionally, waiting until the entire 3D stack has been assembled before performing testing may result in the rejection of the entire 3D stack thereby substantially reducing yield and adding substantially to the cost of manufacture. Moreover, seeing the bonded interface through the glass may be useful in that it may be verified that processing has not generated small voids in the bonding adhesive itself, which can lead to yield loss during thinning and vacuum processing. Because defects such as these may be known to exist at early stages of processing, subsequent processing steps performed on the wafer defective may be avoided.

Referring to step S310 in FIG. 2c, when the processing, testing and repair is complete, and it is time to debond the device wafer 21 from the handling wafer 22, a laser may be used to irradiate the adhesive and release layer 24. The adhesive and release layer 24 may be irradiated though the handling wafer 22, which may be transparent, at least to the wavelength of the laser used. The laser may produce a spot beam that is scanned across the surface of the handling wafer 22, for example, in a raster pattern, or the laser may produce a fan beam that is swept once or multiple times across the handling wafer 22. Directing of the light radiated from the laser may be handled by the use of a scanner and lens, which may be, for example, an F-Theta scan lens having an 810 mm fl. FIGS. 5a and 5b are a schematic diagram illustrating pattern of applying the laser light to a top surface 31 of the handling wafer 22 in accordance with exemplary embodiments of the present invention. As seen in FIG. 5a, the laser light may be directed across the top surface 31 of the handling wafer 22 as a spot beam drawn to lines 32 which move along an x-axis direction of the top surface 31 of the handling wafer 22 with each successive line 32 being drawn lower in the y-axis direction. Alternatively, as seen in FIG. 5b, the laser light may be directed in a serpentine pattern 33.

As the UV wavelength of the laser used may contain relatively high energy, the light may efficiently ablate the adhesive and release layer 24. Once ablated, the device wafer 21 may be freely removed from the handling wafer 22. Thereafter, if necessary, a solvent or cleaning chemical may be used to remove any remaining elements of the adhesive and release layer 24 and/or adhesive and release layer 24 that may remain on the device wafer 21. The debonded and cleaned device wafer 21 may then be further processed, diced and applied to a 3D stack and/or joined to a package or another 3D element.

In additional embodiments, the handling wafer 22 may be left adhered to the device wafer 21, in order to act as a transparent interposer or a transparent board during subsequent semiconductor manufacture. In such embodiments, the adhesive and release layer 24 may be selected without regard to the need to release the handling wafer 22 from the device wafer 21.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A semiconductor structure comprising:
   a support wafer, wherein the support wafer comprises a transparent wafer and an opaque surface on at least a portion of a surface of the transparent wafer;
   a semiconductor wafer bonded to the support wafer.

2. The structure of claim 1, wherein the opaque surface covers an entire surface of the support wafer.

3. The structure of claim 2, wherein the opaque surface is frosted glass.

4. The structure of claim 1, wherein the opaque surface covers only an outer edge of a surface of the support wafer.

5. The structure of claim 4, wherein the opaque surface comprises at least a metal, a metal nitride or a metal oxide.

6. The structure of claim 4, wherein the opaque surface covers only an outer annular edge of a the surface of the support wafer.

7. The structure of claim 6, wherein the transparent wafer and opaque surface are separate layers in direct contact with each other.

8. The structure of claim 7, further comprising a clarifying layer on the opaque surface.

9. The structure of claim 8, wherein the clarifying layer includes a similar refractive index as the opaque surface.

* * * * *